US008059318B2

(12) United States Patent
(10) Patent No.: US 8,059,318 B2
(45) Date of Patent: Nov. 15, 2011

Maebashi et al.

(54) COLOR IMAGE FORMING APPARATUS AND CONTROL METHOD THEREFOR

(75) Inventors: Yoichiro Maebashi, Tokyo (JP); Shinji Katagiri, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 817 days.

(21) Appl. No.: 11/114,079

(22) Filed: Apr. 26, 2005

(65) Prior Publication Data

US 2005/0260004 A1 Nov. 24, 2005

(30) Foreign Application Priority Data

May 7, 2004 (JP) ................................ 2004-139096

(51) Int. Cl.
*G03G 15/01* (2006.01)
*G03F 3/08* (2006.01)

(52) U.S. Cl. .......... 358/504; 358/1.1; 358/1.9; 358/518; 399/15; 399/38; 399/49; 399/61; 399/72

(58) Field of Classification Search .................. 358/1.1, 358/1.9, 504; 399/9, 38, 45, 46, 49, 58, 60, 399/61, 72, 14–15
See application file for complete search history.

(56) References Cited

U.S. PATENT DOCUMENTS 5,450,165 A 9/1995 Henderson ...................... 399/49
5,887,223 A * 3/1999 Sakai et al. ..................... 399/60
6,031,629 A 2/2000 Shibuya et al.
6,070,022 A * 5/2000 Kobayashi et al. ............. 399/12
6,243,542 B1 * 6/2001 Fujimoto et al. ................ 399/49
6,371,889 B1 4/2002 Kuroda et al. ................ 477/181
6,450,606 B1 9/2002 Kato et al. ....................... 347/19
6,693,654 B2 2/2004 Shinohara ...................... 347/116
6,731,889 B2 5/2004 Nakayama ....................... 399/49
6,853,815 B2 2/2005 Tezuka et al. ................... 399/39
6,898,381 B2 5/2005 Maebashi et al. ............... 399/15
6,985,678 B2 1/2006 Maebashi et al.
7,097,270 B2 8/2006 Yamazaki ........................ 347/19
7,151,248 B2 12/2006 Harush et al. ................. 250/221
7,206,068 B2 4/2007 Suzuki ........................... 356/244
7,269,369 B2 9/2007 Tezuka et al. ................... 299/72
7,280,778 B2 * 10/2007 Maebashi et al. ............... 399/49
2002/0181964 A1 12/2002 Campbell et al. ............... 399/49
(Continued)

FOREIGN PATENT DOCUMENTS

CN 1410841 A 4/2003
(Continued)

OTHER PUBLICATIONS

Office Action, dated Apr. 6, 2009, in JP 2004-139096.

*Primary Examiner* — James A Thompson
*Assistant Examiner* — Kent Yip
(74) *Attorney, Agent, or Firm* — Fitzpatrick, Cella, Harper & Scinto

(57) ABSTRACT

A color image forming apparatus includes a density sensor which detects the light reflecting characteristics of an unfixed toner image formed on an image carrier or a transfer material carrier, and a color sensor which detects the light reflecting characteristics of the fixed toner image formed on a transfer material. A test image is formed on the transfer material in accordance with the detection result of the density sensor, and a density control process of controlling image forming conditions is controlled to be executed in accordance with a detection result of detecting the test image by the color sensor.

6 Claims, 17 Drawing Sheets

U.S. PATENT DOCUMENTS

| | | | | |
|---|---|---|---|---|
| 2003/0049040 | A1 | 3/2003 | Tezuka et al. | |
| 2003/0085941 | A1 | 5/2003 | Tezuka et al. | 347/19 |
| 2003/0090693 | A1 | 5/2003 | Tezuka et al. | 358/1.9 |
| 2003/0138261 | A1 | 7/2003 | Tezuka et al. | 399/49 |
| 2004/0042807 | A1 | 3/2004 | Nakayama | 399/49 |
| 2004/0062560 | A1 | 4/2004 | Mochizuki et al. | 399/49 |
| 2004/0081477 | A1 | 4/2004 | Maebashi et al. | |
| 2004/0096231 | A1 | 5/2004 | Furno et al. | 399/49 |
| 2004/0136739 | A1 * | 7/2004 | Nakamura et al. | 399/49 |
| 2004/0208662 | A1 | 10/2004 | Ichikawa et al. | 399/49 |
| 2005/0088672 | A1 * | 4/2005 | Johnson | 358/1.9 |
| 2005/0211902 | A1 * | 9/2005 | Barry et al. | 250/341.1 |
| 2005/0248789 | A1 | 11/2005 | Kita et al. | 358/1.9 |
| 2005/0260003 | A1 | 11/2005 | Tezuka | 399/15 |
| 2006/0023272 | A1 | 2/2006 | Tezuka | 358/518 |

FOREIGN PATENT DOCUMENTS

| | | | |
|---|---|---|---|
| CN | 1417650 | A | 5/2003 |
| EP | 1 152 598 | A2 | 11/2001 |
| EP | 1 291 731 | A1 | 3/2003 |
| EP | 1 298 500 | A2 | 4/2003 |
| EP | 1 310 832 | A | 5/2003 |
| JP | 07-055703 | | 3/1995 |
| JP | 10-193688 | | 7/1998 |
| JP | 11-119481 | | 4/1999 |
| JP | 11-136532 | | 5/1999 |
| JP | 3430702 | | 5/2002 |
| JP | 2003-084532 | | 3/2003 |
| JP | 2003107835 | A | 4/2003 |
| JP | 2003-150006 | | 5/2003 |
| JP | 2003-287934 | | 10/2003 |
| JP | 2004-101911 | | 4/2004 |

* cited by examiner

COLOR IMAGE FORMING APPARATUS AND CONTROL METHOD THEREFOR

FIELD OF THE INVENTION

The present invention relates to a color image forming apparatus for forming a color image on a recording medium by using a plurality of coloring materials, and a control method therefor.

BACKGROUND OF THE INVENTION

Recently, color image forming apparatuses adopting electrophotography, inkjet printing, and the like require higher resolution and higher image quality. In particular, the tonality of a formed color image and the stability of density in a formed image greatly influence the image forming characteristics of the color image forming apparatus. It is known that the density of an image formed by the color image forming apparatus varies upon a change in environment and long-time use. Especially an electrophotographic color image forming apparatus loses the color balance of a formed image upon even small density variations, and efforts must be made to always keep its density characteristics to tonality constant. For this purpose, the electrophotographic color image forming apparatus obtains a stable image by the following density control process. First, a toner image (to be referred to as a patch hereinafter) for detecting density is formed on an intermediate transfer material, photosensitive member, or the like with toner of each color. Then, the density of the unfixed toner patch is detected by a toner density detection sensor (to be referred to as a density sensor hereinafter), the detection result is fed back to process conditions such as the amount of exposure light and the bias voltage for development.

In density control using the density sensor, a patch is formed on an intermediate transfer material, photosensitive drum, or the like, and detected. This density control cannot follow a change in the color balance of an image that is caused by variations in transfer and fixing characteristics onto a transfer material (sheet). To solve this problem, there has been proposed a color image forming apparatus which adopts a sensor (to be referred to as a color sensor hereinafter) for detecting the density or color of a patch transferred onto a transfer material (sheet) (Japanese Patent Laid-Open No. 2003-287934).

This color sensor can read a color patch on the transfer material and obtain an RGB signal corresponding to the color of the color patch. By performing density control (tonality control) using an output from the color sensor, higher-precision density control can be realized.

However, control using the color sensor consumes transfer materials and toner because a patch must be formed on a transfer material such as a recording paper sheet. Hence, density control using a patch cannot be frequently executed, and effective density control must be performed while minimizing the execution count of density or chromaticity control (to be referred to as color sensor control hereinafter) using the color sensor.

Density variations (also including variations in transfer/fixing characteristics) in an electrophotographic image forming apparatus occur depending on the state of the use environment, the conditions of an image pattern to be printed, and the like. The degree of density variations greatly changes depending on the use conditions of the apparatus, and is hard to predict. The density may or may not vary greatly depending on the difference in use conditions. Since the image forming apparatus must always form an image at a stable density, dolor sensor control must be executed assuming the case where the density varies most greatly (abruptly). That is, if color sensor control is done while the density of a formed image varies little, unnecessary control is executed, wastefully consuming toner or paper.

SUMMARY OF THE INVENTION

The present invention has been made to overcome the conventional problems, and has as its feature to solve the drawbacks of the prior art.

It is another feature of the present invention to provide a color image forming apparatus capable of more efficiently executing a process of detecting the density of a test image formed on a transfer material and controlling image forming conditions in accordance with the detection result, and a control method therefor.

According to an aspect of the present invention, there is provided with a color image forming apparatus comprising:

first optical detection means for detecting light reflecting characteristics of an unfixed toner image formed on an image carrier or a transfer material carrier;

second optical detection means for detecting the light reflecting characteristics of the toner image which is transferred from the image carrier or the transfer material carrier onto a transfer material and is fixed;

density control means for forming a test image on the transfer material and controlling image forming conditions in accordance with a detection result of detecting the test image by the second optical detection means; and control means for controlling to execute density control by the density control means in accordance with a detection result of the first optical detection means.

According to another aspect of the present invention, there is provided with a method of controlling a color image forming apparatus which forms a color image on a transfer material by using a plurality of coloring materials, comprising:

a step of detecting, by using a first optical detection sensor, light reflecting characteristics of an unfixed toner image formed on an image carrier or a transfer material carrier;

a step of detecting, by using a second optical detection sensor, the light reflecting characteristics of the fixed toner image formed from the image carrier or the transfer material carrier onto a transfer material;

a density control step of forming a test image on the transfer material and controlling image forming conditions in accordance with a detection result of detecting the test image by the second optical detection sensor; and a control step of controlling to execute the density control step in accordance with a detection result of the first optical detection sensor.

The above features are achieved by a combination of features described in main claims, and subclaims define merely advantageous concrete examples.

The general description of the present invention does not list all necessary features, and a subcombination of features can constitute the invention.

Other features, objects and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail below with reference to the accompanying drawings. The following embodiments do not limit the invention defined by claims, and all combinations of features to be described in the embodiments are not indispensable to the solving means of the invention.

The embodiments will describe the following technique in an image forming apparatus which controls the density of a formed image by detecting by a color sensor the light reflecting characteristics of a fixed toner image formed on a transfer material. That is, the light reflecting characteristics of a toner patch before transfer that is formed on an image carrier (photosensitive drum or intermediate transfer material) are detected by a density sensor, and the color sensor control is executed on the basis of the detection result. This technique stabilizes the density of a formed image and allows formation of an image at a desired density while decreasing the execution count of color sensor control and suppressing increases in print standby time and print cost.

Figure 1:
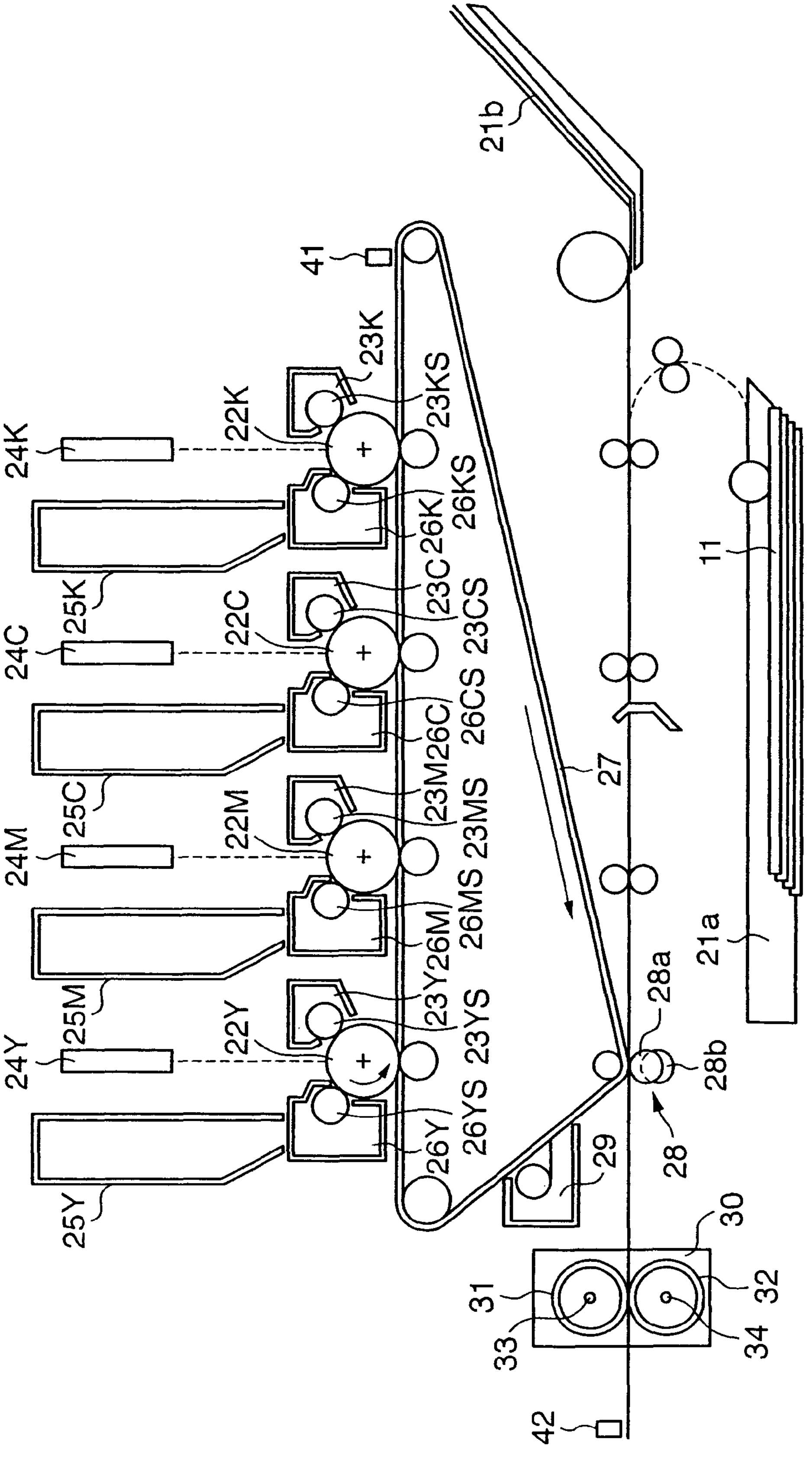
FIG. 1 depicts a view showing the arrangement of the image forming section of a tandem color image forming apparatus adopting an intermediate transfer material as an example of an electrophotographic color image forming apparatus according to an embodiment of the present invention.

FIG. 1 depicts a view showing the arrangement of the image forming section of a tandem color image forming apparatus (color laser beam printer) adopting an intermediate transfer material 27 (belt) as an example of an electrophotographic color image forming apparatus according to an embodiment of the present invention.

In the image forming section of the color image forming apparatus according to the embodiment, as shown in FIG. 1, static latent images are respectively formed on photosensitive drums with laser beams controlled by an image processor (not shown) on the basis of corresponding color image signals, and these static latent images are developed with toners of corresponding colors to form single color toner images on each drum. The single color toner images are superposed on each other on the intermediate transfer material 27 to form a multi-color toner image. The multi-color toner image is transferred onto a transfer material 11, and the multi-color toner image on the transfer material 11 is fixed by a fixing unit, forming an image.

The image forming section comprises paper cassettes 21*a* and 21*b*, photosensitive members (to be referred to as photosensitive drums hereinafter) 22Y, 22M, 22C, and 22K corresponding to stations which are arranged side by side by the number of developing colors, chargers 23Y, 23M, 23C, and 23K which constitute charge means as primary charge means, toner cartridges 25Y, 25M, 25C, and 25K, developers 26Y, 26M, 26C, and 26K which constitute developing means, the intermediate transfer material 27, a transfer roller 28, and a fixing unit 30.

Each of the photosensitive drums 22Y, 22M, 22C, and 22K is configured by forming an organic photoconductive layer around an aluminum cylinder. The photosensitive drums 22Y, 22M, 22C, and 22K are rotated counterclockwise in FIG. 1 in accordance with image forming operation by transmitting the driving force of a driving motor (not shown). The respective stations comprise, as primary charge means, the chargers 23Y, 23M, 23C, and 23K for respectively charging the photosensitive drums 22Y, 22M, 22C, and 22K for yellow (Y), magenta (M), cyan (C), and black (K). The respective chargers comprise sleeves 23YS, 23MS, 23CS, and 23KS. Laser beams to be sent to the photosensitive drums 22Y, 22M, 22C, and 22K are emitted by corresponding scanners 24Y, 24M, 24C, and 24K, and selectively expose the surfaces of the photosensitive drums 22Y, 22M, 22C, and 22K to form static latent images corresponding to each color. The respective stations comprise, as developing means, the developers 26Y, 26M, 26C, and 26K for development in yellow (Y), magenta (M), cyan (C), and black (K), and the respective developers comprise sleeves 26YS, 26MS, 26CS, and 26KS. These developers are detachably attached to the image forming apparatus. The intermediate transfer material 27 is in contact with the photosensitive drums 22Y, 22M, 22C, and 22K. In forming a color image, the intermediate transfer material 27 rotates clockwise along with rotation of the photosensitive drums 22Y, 22M, 22C, and 22K, transferring toner images of the respective colors on each other on the intermediate transfer material 27. After that, the transfer roller 28 (to be described later) comes into contact with the intermediate transfer material 27 (at a position 28a), the transfer material 11 is clamped and conveyed by the transfer roller 28 and intermediate transfer material 27, and the multi-color toner image on the intermediate transfer material 27 is transferred onto the transfer material 11. The transfer roller 28 abuts against the transfer material 11 at the position 28*a* while the multi-color toner image is transferred onto the transfer material 11, and leaves the transfer material 11 at a position 28*b* after the transfer process.

The fixing unit 30 fuses and fixes the multi-color toner image transferred onto the transfer material 11 while conveying the transfer material 11. As shown in FIG. 1, the fixing unit 30 comprises a fix roller 31 which heats the transfer material 11, and a press roller 32 which presses the transfer material 11 against the fix roller 31. The fix roller 31 and press roller 32 are formed into a cylindrical shape, and incorporate heaters 33 and 34, respectively. The transfer material 11 bearing the multi-color toner image is conveyed by the fix roller 31 and press roller 32, and receives heat and a pressure to fix toner onto the surface of the transfer material 11. The transfer material 11 on which the toner image has been fixed is discharged onto a delivery tray (not shown) by rotation of a discharge roller (not shown), and image forming operation ends.

A cleaning unit 29 removes toner remaining on the intermediate transfer material 27. The removed waste toner is stored in a cleaner container (not shown). Reference numeral 42 denotes a color sensor which optically detects the color of a color image (in this case, a color patch) transferred and fixed onto the transfer material 11. The paper cassette 21*a* stacks and stores a plurality of transfer materials 11 (recording sheets or the like). Also, the paper tray 21*b* stacks and stores a plurality of transfer materials 11 (recording sheets or the like). A density sensor 41 faces the intermediate transfer material 27, and is used to measure the toner density of a patch formed on the surface of the intermediate transfer material 27.

Figure 2:
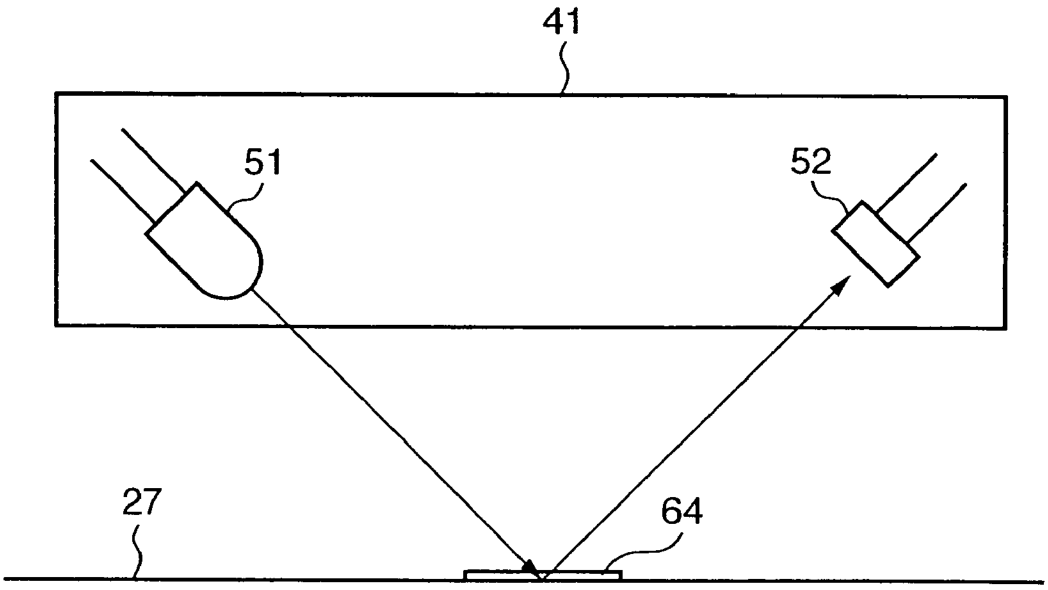
FIG. 2 depicts a view showing an example of the arrangement of a density sensor which detects the density of unfixed toner on the intermediate transfer material according to the embodiment.

FIG. 2 depicts a view for explaining the arrangement of the density sensor 41 according to the embodiment.

The density sensor 41 is made up of an infrared light emitting device 51 such as an LED, a light sensor 52 such as a photodiode, an IC (not shown) for processing light data, and a holder (not shown) which stores these members. The infrared light emitting device 51 is set at an angle of almost 45° with respect to a direction perpendicular to the intermediate transfer material 27, and irradiates a toner patch 64 on the intermediate transfer material 27 with infrared light. The light sensor 52 is set at a position symmetrical to the light emitting device 51, and detects light regularly reflected by the toner patch 64. An optical device (not shown) such as a lens may be used to couple the light emitting device 51 and light sensor 52.

In the embodiment, the intermediate transfer material 27 is a polyimide single-layer resin belt. A proper amount of carbon fine particles is dispersed in the resin in order to adjust the resistance of the belt, and the surface color of the belt is black. The surface of the intermediate transfer material 27 is smooth and glossy, and the glossiness is about 100% (measured with a glossimeter IG-320 available from Horiba).

When the surface of the intermediate transfer material 27 is exposed (toner density is "0"), the light sensor 52 of the density sensor 41 detects light regularly reflected by the intermediate transfer material 27. This is because the surface of the intermediate transfer material 27 is glossy; as described above. When the toner patch 64 is formed on the intermediate transfer material 27, regularly reflected light decreases gradually as the density of the toner patch 64 increases. This is because light regularly reflected by the surface of the intermediate transfer material 27 is decreased by covering the surface of the intermediate transfer material 27 with toner.

In the color image forming apparatus shown in FIG. 1, the color sensor 42 is arranged on the downstream side of the fixing unit 30 on the transfer material convey path so as to face the image forming surface of the transfer material 11. The color sensor 42 outputs an RGB signal on the basis of the intensity of light reflected by a fixed color-mixed patch formed on the transfer material 11. Accordingly, the density of the transferred/fixed image can be automatically detected before the fixed image is delivered to the delivery unit.

Figure 3A:
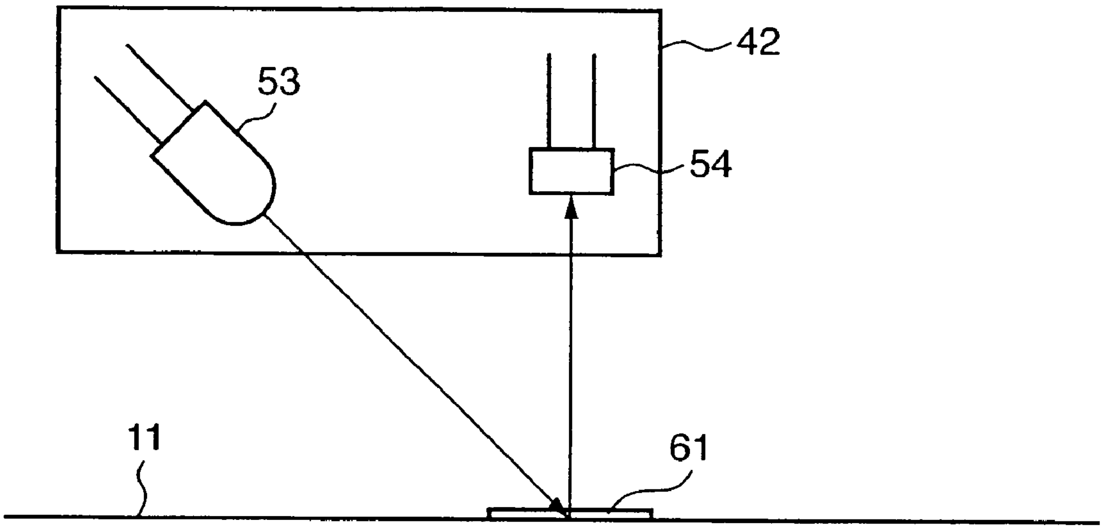
FIGS. 3A and 3B depict views for explaining the arrangement of a color sensor according to the embodiment of the present invention.
Figure 3B:
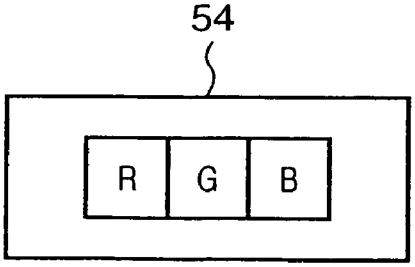

FIGS. 3A and 3B depict views showing an example of the arrangement of the color sensor 42 according to the embodiment.

In FIG. 3A, the color sensor 42 comprises a white LED 53 and a charge storage sensor 54 with an RGB on-chip filter. Light is emitted by the white LED 53 obliquely at 45° to the transfer material 11 having a fixed patch 61, and the intensity of light diffusedly reflected at 0° is detected by the charge storage sensor 54 with the RGB on-chip filter.

FIG. 3B shows the light sensing portion of the charge storage sensor 54 with the RGB on-chip filter. In FIG. 3B, the light sensing portion has R, G, and B filters, and they output R, G, and B signals as independent pixels.

The charge storage sensor 54 with the RGB on-chip filter may be a photodiode, or several sets of three R, G, and B pixels may be arranged side by side. The incident angle may be 0°, and the reflection angle may be 45°. The charge storage sensor may be made up of an LED which emits beams of three, R, G, and B colors and a sensor with no filter.

Figure 4:
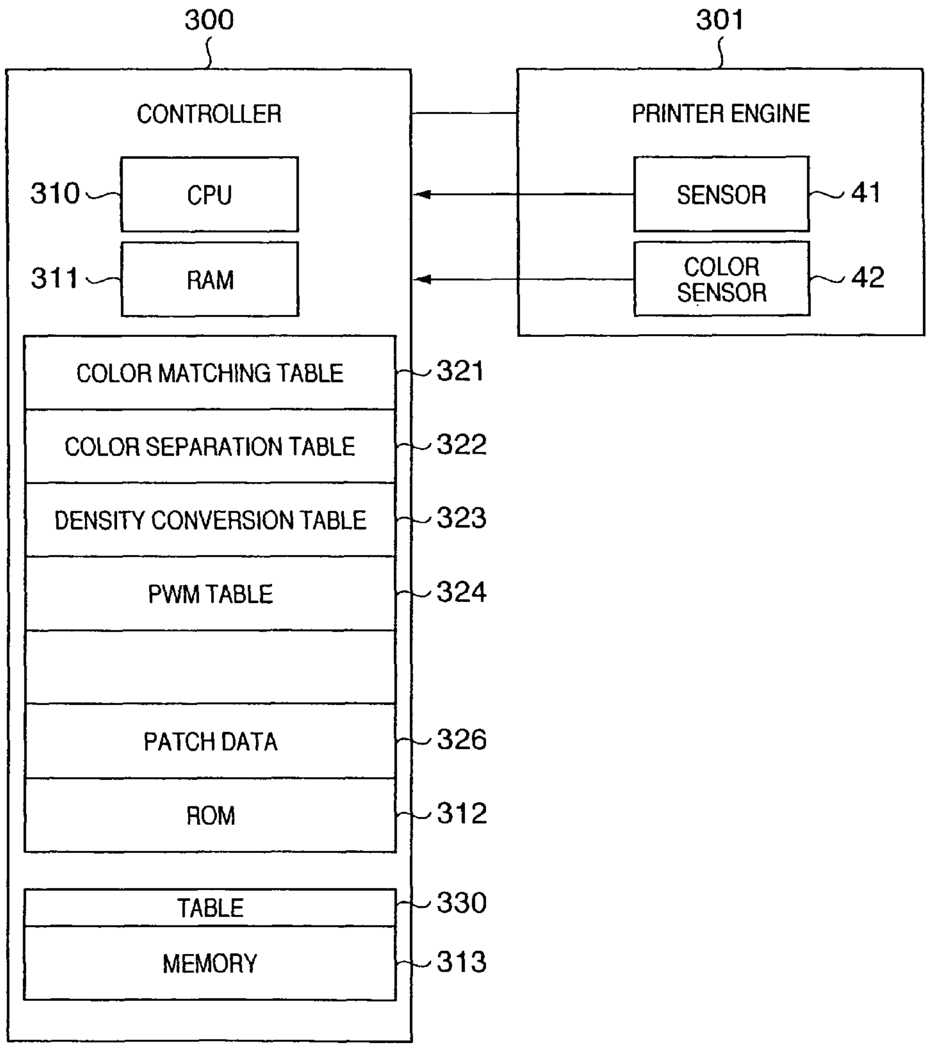
FIG. 4 is a block diagram showing the arrangement of the color image forming apparatus according to the embodiment.

FIG. 4 is a block diagram showing the arrangement of the color image forming apparatus according to the embodiment.

In FIG. 4, reference numeral 300 denotes a controller which controls the operation of the whole color image forming apparatus. A printer engine 301 has an image forming section having the arrangement as shown in FIG. 1, and forms an image on a recording paper sheet serving as a transfer material in accordance with a control signal and data from the controller 300.

The controller 300 comprises a CPU 310 such as a microprocessor, a RAM 311 which is used as a work area for storing various data in control operation by the CPU 310 and temporarily stores various data, and a ROM 312 which stores programs and data to be executed by the CPU 310. The ROM 312 holds a color matching table 321, color separation table 322, density conversion table 323, and PWM table 324. The ROM 312 also provides a patch data area 326 which stores patch data (to be described later). A memory 313 is a rewritable nonvolatile memory which stores table 1 (330) to be described later with reference to FIG. 8. If table 1 (330) is fixed, it may also be stored in the ROM 312.

Figure 5:
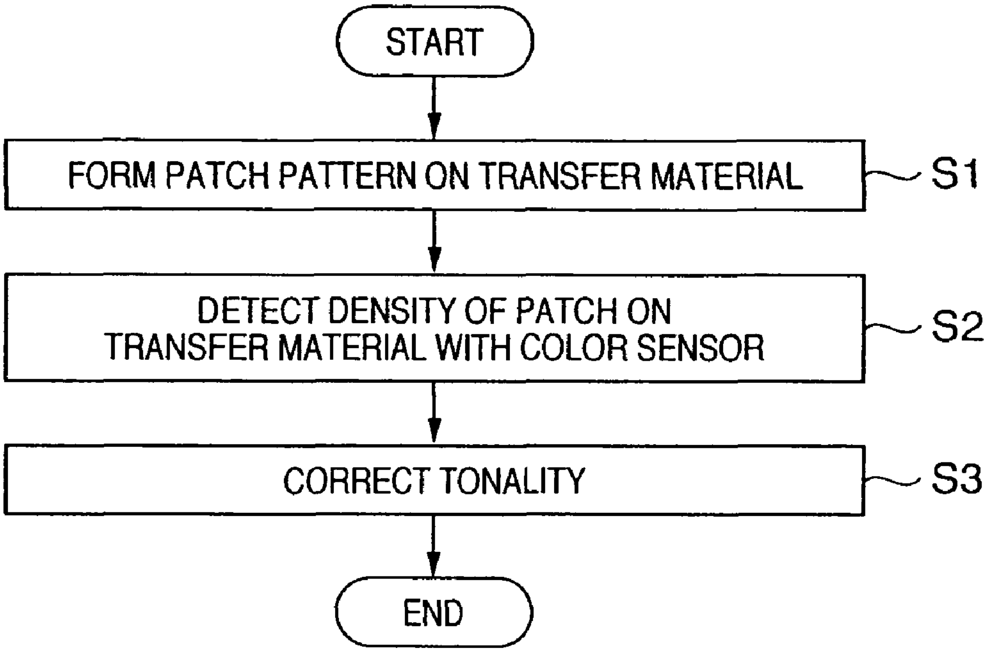
FIG. 5 is a flowchart for explaining a density correction process in the color image forming apparatus according to the embodiment.

FIG. 5 is a flowchart for explaining density control according to the first embodiment. Density control in the first embodiment is tonality correction control using the color sensor 42, and is executed upon power-on of the main body and replacement of the developer and photosensitive member when variations in image density are assumed. Density control is also executed when conditions for executing density control (to be described later) are met during image formation (printing). A program for executing this process is stored in the ROM 312 of the controller 300, and executed under the control of the CPU 310.

In step S1, a patch pattern is formed on the transfer material 11 on the basis of the patch data 326 of the ROM 312. This is performed in the same process step as general color image formation.

Figure 6:
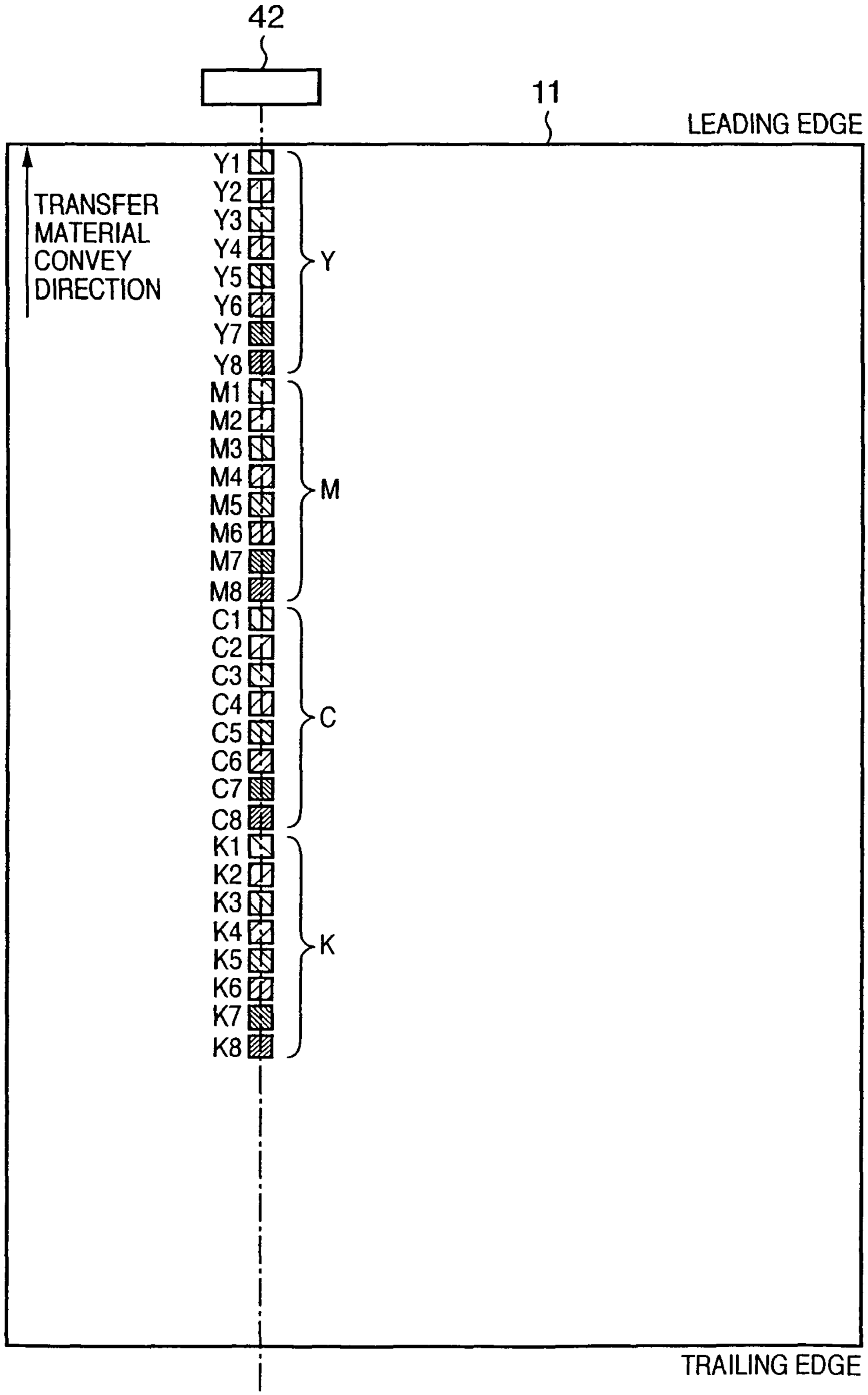
FIG. 6 depicts a view showing an example of a patch pattern formed on a transfer material according to the first embodiment.

FIG. 6 depicts a view showing a patch pattern formed on the transfer material 11 (in this example, A3 size of 297 mm×420 mm and portrait orientation) according to the embodiment.

At which the color sensor 42 is arranged, a total of 32 square patches of 8 mm side are formed at an interval of 10 mm at a portion while the rate of dots in each patch (tonality) is changed in eight stages for each of Y (Yellow), M (Magenta), C (Cyan), and K (blacK) (eight patches for each color). The correspondence between each patch and the rate of dots in each patch (tonality) is 12.5% for Y1, M1, C1, and K1, 25% for Y2, M2, C2, and K2, 37.5% for Y3, M3, C3, and K3, 50% for Y4, M4, C4, and K4, 62.5% for Y5, M5, C5, and K5, 75% for Y6, M6, C6, and K6, 87.5% for Y7, M7, C7, and K7, and 100% for Y8, M8, C8, and K8.

In step S2, the density of a patch transferred and fixed onto the transfer material 11 is detected by the color sensor 42. A method of converting the detection signal of the color sensor 42 into a density exploits a conventionally known detection signal-to-density conversion table (density conversion table 323). In step S3, tonality control (tonality correction) is executed on the basis of the patch density detected in step S2 and the tonality of patch data used to print the patch.

Figure 7:
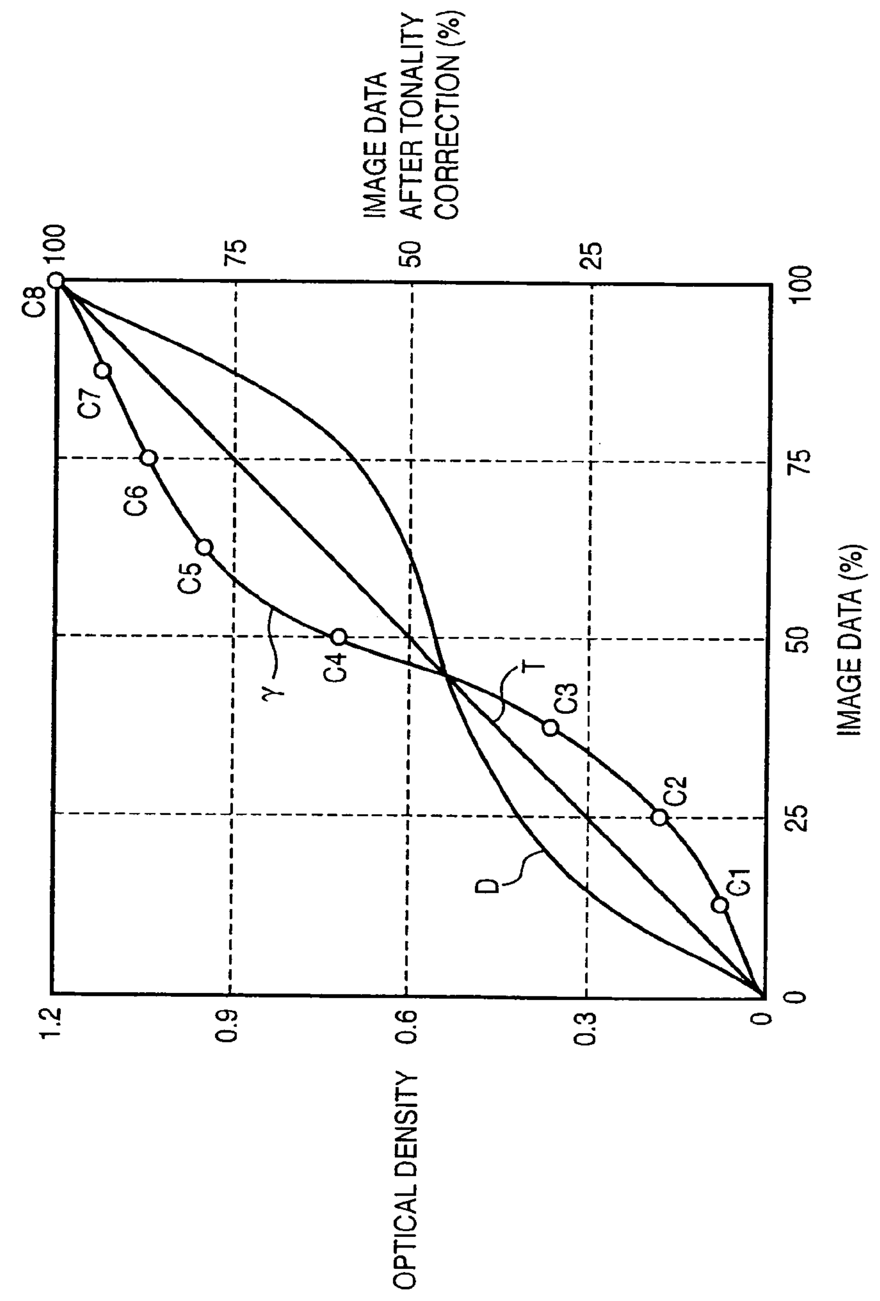
FIG. 7 is a graph for explaining image tonality control (tonality correction) according to the embodiment.

FIG. 7 is a graph for explaining tonality control (tonality correction) according to the first embodiment. Only tonality correction of cyan will be explained, but magenta, yellow, and black are also corrected by the same method.

In FIG. 7, the abscissa represents image data (tonality), and the ordinate represents an optical density value detected by the color sensor 42. In FIG. 7, open circles represent output values from the color sensor 42 for patches C1, C2, C3, C4, C5, C6, C7, and C8 shown in FIG. 6. A straight line T represents target characteristics of density to tonality in density control. In the first embodiment, the target characteristics T of density to tonality are determined so that a tonality given by image data and a density measured by the density sensor 41 are proportional to each other. A curve γ represents the characteristics of density to tonality when no density control (tonality correction control) is performed. As for the densities for tonalities when no patch is formed, a curve passing through the origin, C1, C2, C3, C4, C5, C6, C7, and C8 is calculated by spline interpolation. A curve D represents the characteristics of a tonality correction table calculated by control according to the first embodiment, and is calculated by obtaining the symmetric point of the tonality characteristic y before correction with respect to the target tonality characteristic T. Calculation of the tonality correction table D is executed by the CPU 310, and the calculated tonality correction table D is stored in the nonvolatile memory 313. In forming an image, image data is corrected by referring to the tonality correction table D, and a target tonality characteristic can be obtained.

An outline of image tonality control (image tonality correction control) according to the first embodiment has been described.

Figure 8:
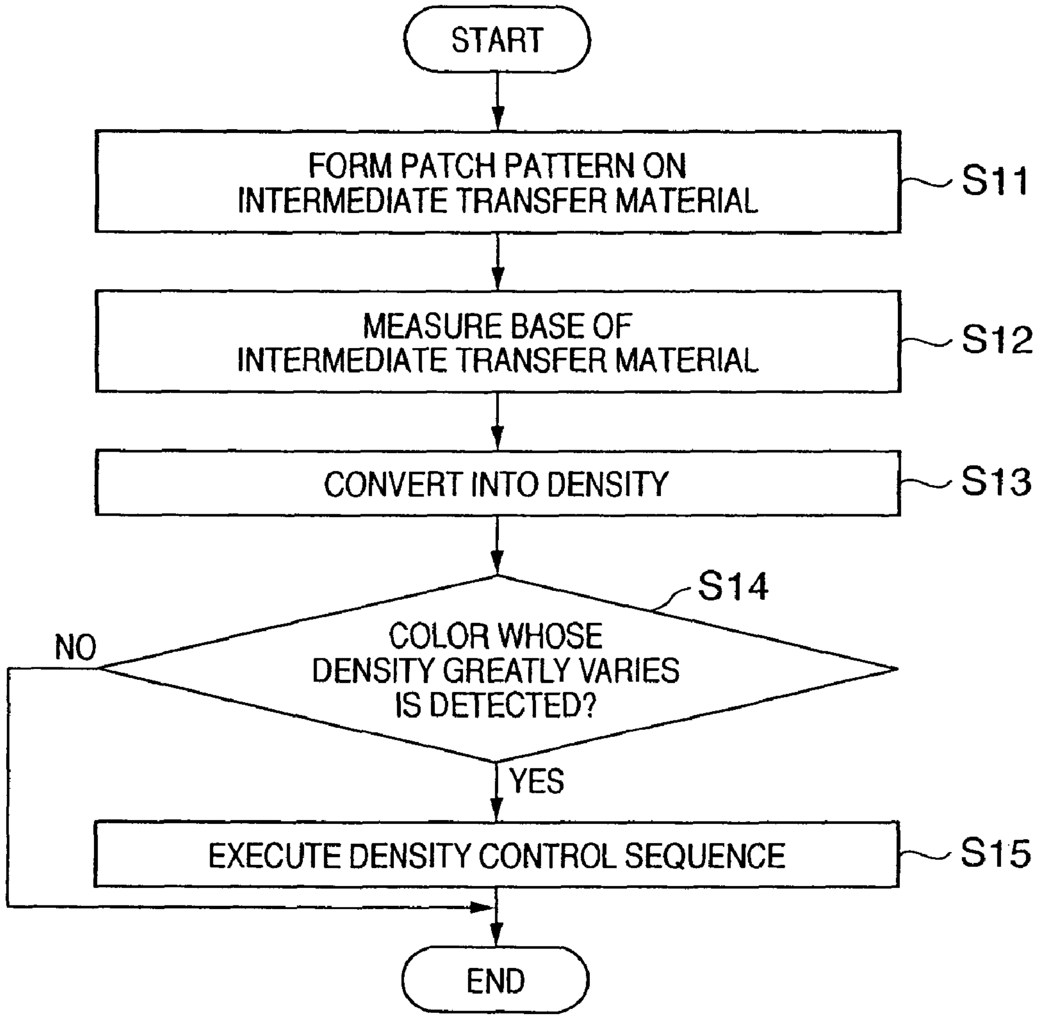
FIG. 8 is a flowchart for explaining a process of determining whether to execute density control using the color sensor as a feature of the first embodiment.

FIG. 8 is a flowchart for explaining a process of determining whether to execute density control using the color sensor 42 as a feature of the first embodiment. A program for executing this process is stored in the ROM 312, and executed under the control of the CPU 310. Determination of whether to execute density control according to the first embodiment is executed every time 50 images are formed (printed). The frequency at which the determination process is done may be set to an optimal value in accordance with the characteristics of an apparatus to which the present invention is applied. For example, it is preferable that the determination process is more frequently performed in an apparatus suffering relatively large density variations and the time interval of the determination process is set large (long) in an apparatus exhibiting a relatively stable density.

In step S11, a patch pattern used to determine whether to execute density control is formed on the intermediate transfer material 27 on the basis of the patch data 326 stored in the ROM 312. The first embodiment adopts a single-color pattern (pattern of one of C, M, Y, and K) whose rate of dots in each patch is 50%. In step S12, the quantity of light reflected by the toner patch 64 formed on the intermediate transfer material 27 is detected by the density sensor 41. In step S13, the signal detected by the density sensor 41 is converted into a density to calculate the density of the toner patch 64 formed on the intermediate transfer material 27. A method of converting the detection signal of the density sensor 41 into a density exploits a conventionally known detection signal-to-density conversion table (density conversion table 323).

In step S14, the variation amount of the density of the toner patch 64 that is obtained in step S13 is attained to determine whether to execute density control using the color sensor 42.

Determination in step S14 will be explained with reference to FIG. 9.

Figure 9:
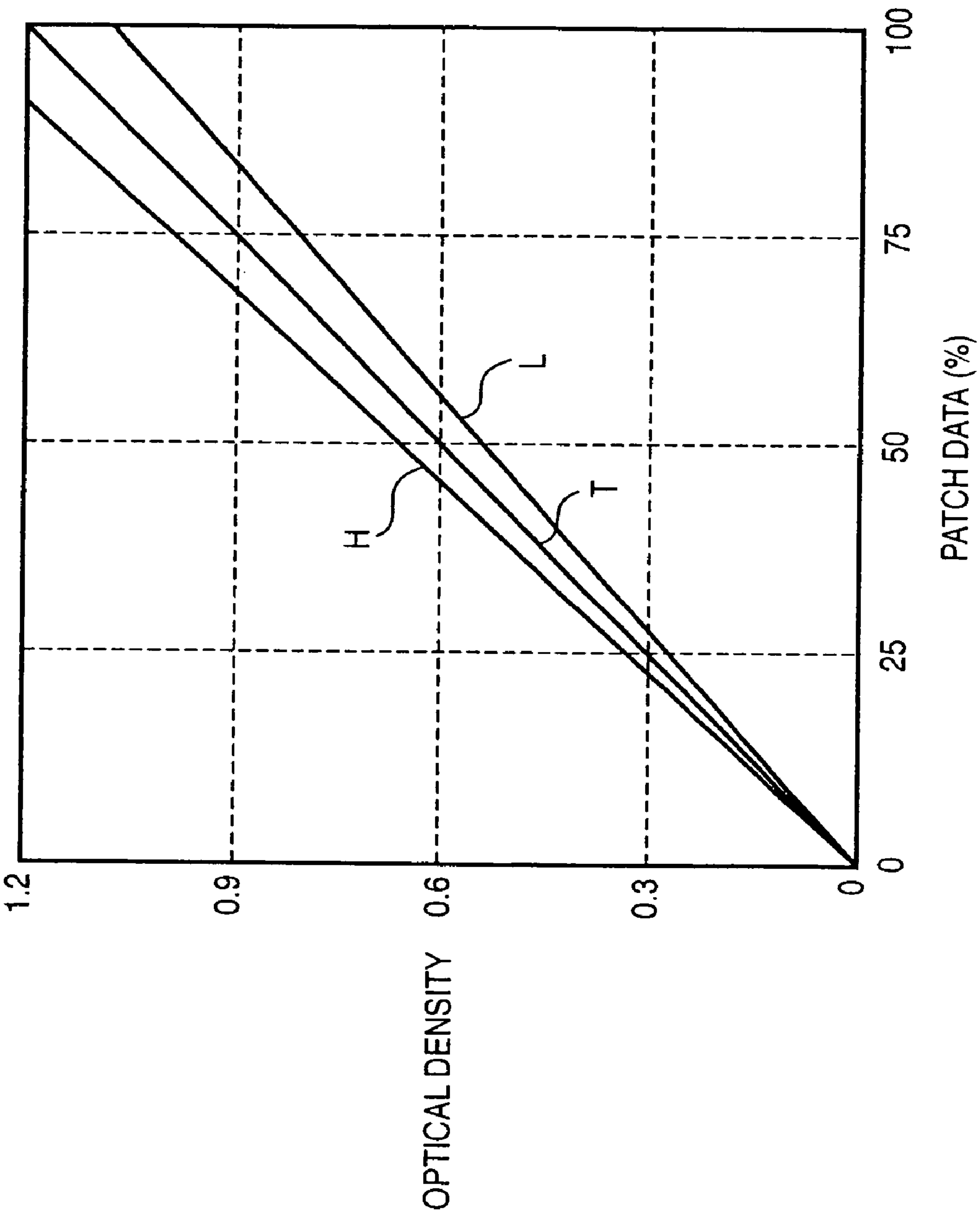
FIG. 9 is a graph for explaining the relationship between the density of patch data and the output value of the density sensor according to the first embodiment.

FIG. 9 is a graph for explaining the relationship between the density of patch data and the output value of the density sensor 41. In FIG. 9, the abscissa represents the tonality of patch data, and the ordinate represents an optical density detected by the density sensor 41.

The straight line T represents target characteristics of density to tonality in the above-described density control. The characteristics of density to tonality immediately after density control coincide with the straight line T. As image formation progresses, the density of a formed image changes, and the characteristics of density to tonality deviate from the straight line T. Straight lines H and L represent the upper limit (straight line H) and lower limit (straight line L) of the allowable range of density variations. When the characteristics of density to tonality fall outside this range, it is determined that density control must be executed. In the first embodiment, the allowable range of density variations is the target tonality characteristic ±10%. This value may be set optimal for the characteristics and specifications of the image forming apparatus. If the calculated density value of the patch falls outside the range between the straight lines H and L (density greatly varies) in step S13, density control is determined to be executed. This determination is performed for each of C, M, Y, and K, and when even one color is determined to require density control, density control is executed. In step S15, the density control sequence is executed. This density control is the same as that described above. The obtained density correction table is stored in the table 330.

In the first embodiment, patch data whose rate of dots in each patch is 50% is employed for a patch pattern used to determine whether to execute density control. However, the present invention is not limited to this, and an optimal pattern is selected in accordance with the characteristics of an applied apparatus.

The first embodiment has exemplified an image forming apparatus using the intermediate transfer material 27 as one form of the color image forming apparatus, but the present invention is not limited to this and can also be applied to another form of the color image forming apparatus. For example, the present invention can also be applied to a color image forming apparatus which directly transfers a toner image on the photosensitive member onto a transfer material on the transfer material carrier (transfer belt or the like), forms a toner patch on the transfer material carrier, and can detect the patch density by the density sensor.

As described above, according to the first embodiment, in the color image forming apparatus which performs density control by detecting by the color sensor the light reflecting characteristics of a fixed patch (test image) formed on a transfer material, the light reflecting characteristics of a toner patch formed on an image carrier or transfer material carrier are detected by the density sensor, and it is determined in accordance with the detection result by the density sensor whether to perform density control using the color sensor. High density stability can be obtained while decreasing the execution count of density control using the color sensor and suppressing increases in image formation standby time and image forming cost.

Second Embodiment

The second embodiment will explain a method of obtaining high density stability while decreasing the execution count of density control using a color sensor 42 and suppressing increases in image formation (print) standby time and print cost. More specifically, in a color image forming apparatus which performs density control by detecting by the color sensor 42 the light reflecting characteristics of a fixed patch formed on a transfer material, a specific image pattern contained in an image signal for forming an image is extracted, the light reflecting characteristics of a toner image formed in accordance with the specific image pattern are detected by a density sensor 41, and it is determined on the basis of the detection result whether to perform density control using the color sensor 42. The overall arrangement of the color image forming apparatus, the arrangements of the density sensor 41 and color sensor 42, and the density control method according to the second embodiment are the same as those of the image forming apparatus described in the first embodiment, and a description thereof will be omitted.

Figure 10:
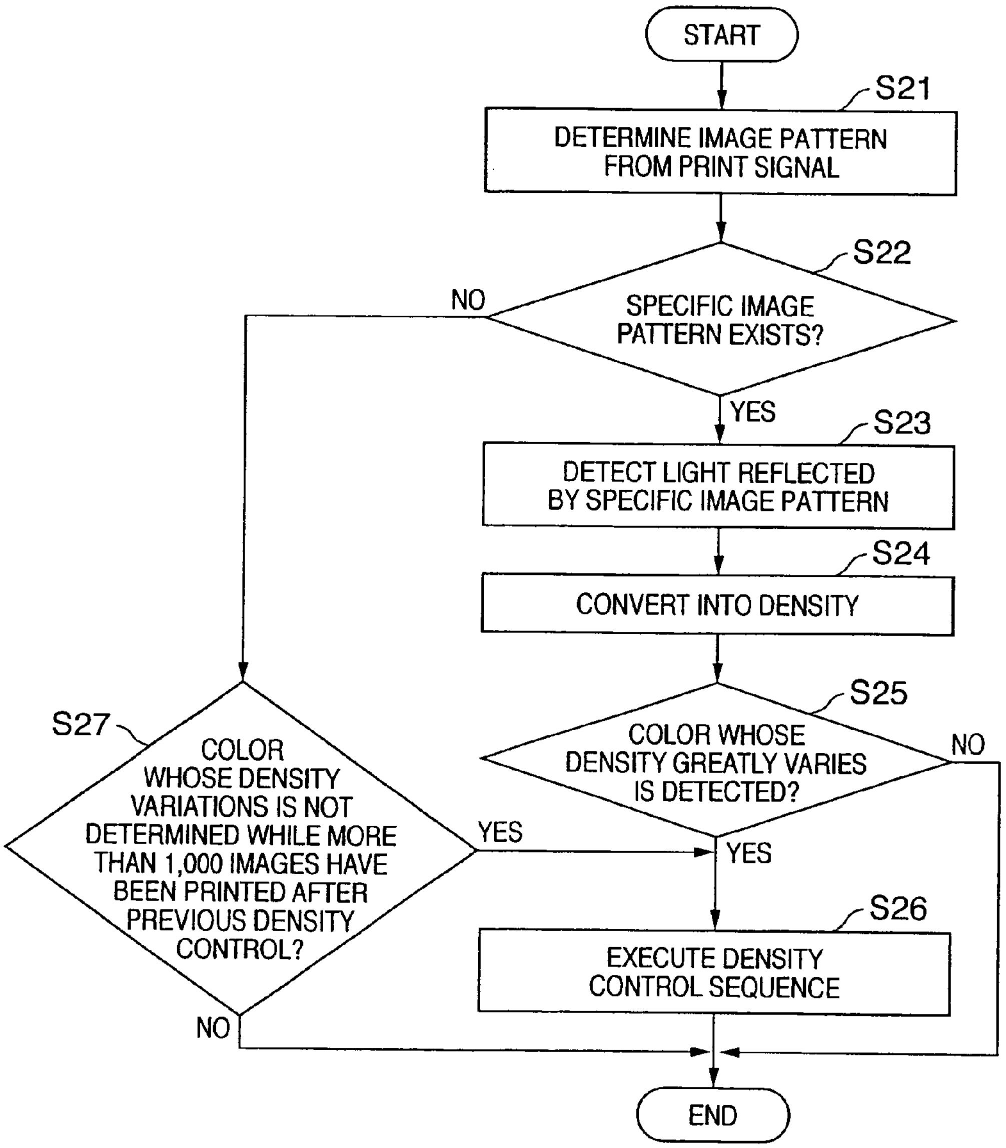
FIG. 10 is a flowchart for explaining a process of determining whether to execute density control in a color image forming-apparatus according to the second embodiment of the present invention.

FIG. 10 is a flowchart for explaining a method of determining whether to execute density control in the color image forming apparatus according to the second embodiment of the present invention. A program for executing this process is stored in a ROM 312, and executed under the control of a CPU 310.

Determination of whether to execute density control according to the second embodiment is executed in general image formation. This control flow is, therefore, executed every image formation. In step S21, an image signal used to form an image is examined and it is determined at a step S22 whether the image signal has a specific pattern which can be used to determine whether to execute density control. In the second embodiment, density control is determined to be executed if a single-color pattern (pattern of one of C, M, Y, and K) whose rate of dots in each patch is 30% to 70% exists in a region detectable by the density sensor 41 (center in the scan direction, i.e., the attaching portion of the density sensor 41). The rate of dots in each patch of a pattern used for determination is set to 30% to 70% because a pattern of an excessively low or high density inhibits accurate determination. The rate of dots in each patch is preferably properly set in accordance with the characteristics of an applied color image forming apparatus.

If a specific pattern is determined to be contained, the process advances to step S23 to detect by the density sensor 41 the quantity of light reflected by the toner image of the specific pattern formed on an intermediate transfer material 27. In step S24, the density of the pattern is obtained on the basis of the quantity of reflected light. In step S25, whether to execute density control is determined on the basis of the degree of difference of the density obtained in step S24 from the tonality of the pattern. This determination method is the same as that in the first embodiment described above. If the density varies by a predetermined amount or more, the density control sequence using the color sensor 42 is executed in step S26. Density control is the same as that in the first embodiment.

If no specific pattern is detected in step S22, the process advances to step S27. Even when printing is performed many times, a pattern which can be used to determine density control is not extracted. Thus, if determination of whether to execute density control is not performed though a predetermined number of (in the second embodiment, more than 1,000) images are formed, it is determined that great density variations may have already occurred. In this case, the process advances to step S26 to execute density control. Note that the predetermined number of images may be properly set to an optimal value.

As described above, according to the second embodiment, in a color image forming apparatus which performs density control by detecting by the color sensor the light reflecting characteristics of a fixed patch formed on a transfer material, a specific pattern contained in an image signal for forming an image is extracted, the light reflecting characteristics of a toner image formed in accordance with the specific pattern are detected by the density sensor 41, and density control using the color sensor 42 is performed in accordance with the detection result. Consequently, the execution count of density control using the color sensor 42 is decreased, and no new control time and toner are required for determination. This can suppress increases in standby time and image forming cost.

Third Embodiment

The third embodiment will explain a method of obtaining high density stability while decreasing the execution count of output correction of a density sensor 41 by using a color sensor 42 and suppressing increases in print standby time and print cost. More specifically, the output value of the density sensor 41 is corrected in accordance with the calculation result of a density control means in an image forming apparatus having the density control means for detecting by the density sensor 41 the density of an unfixed toner image formed on an image carrier and controlling image forming conditions in accordance with the detection result, and an output correction means for detecting by the color sensor 42 the light reflecting characteristics of a toner image on a transfer material 11 and correcting the output value of the density sensor 41 on the basis of the detection result. The overall arrangement of the color image forming apparatus and the arrangements of the density sensor 41 and color sensor 42 according to the third embodiment are the same as those of the image forming apparatus described in the first embodiment, and a description thereof will be omitted.

Density control according to the third embodiment will be explained.

Density control is periodically executed using the density sensor 41.

Density control in the color image forming apparatus according to the third embodiment is executed when the apparatus is powered on, when the developer or photosensitive drum is replaced, or every time a predetermined number of images are printed (in this example, 200 images are printed). In other words, density control is executed when density variations are predicted. At this time, an output from the density sensor 41 is corrected with a correction table (330) calculated in every correction control by the color sensor 42 (to be described later). Details of density control will be described.

Figure 11:
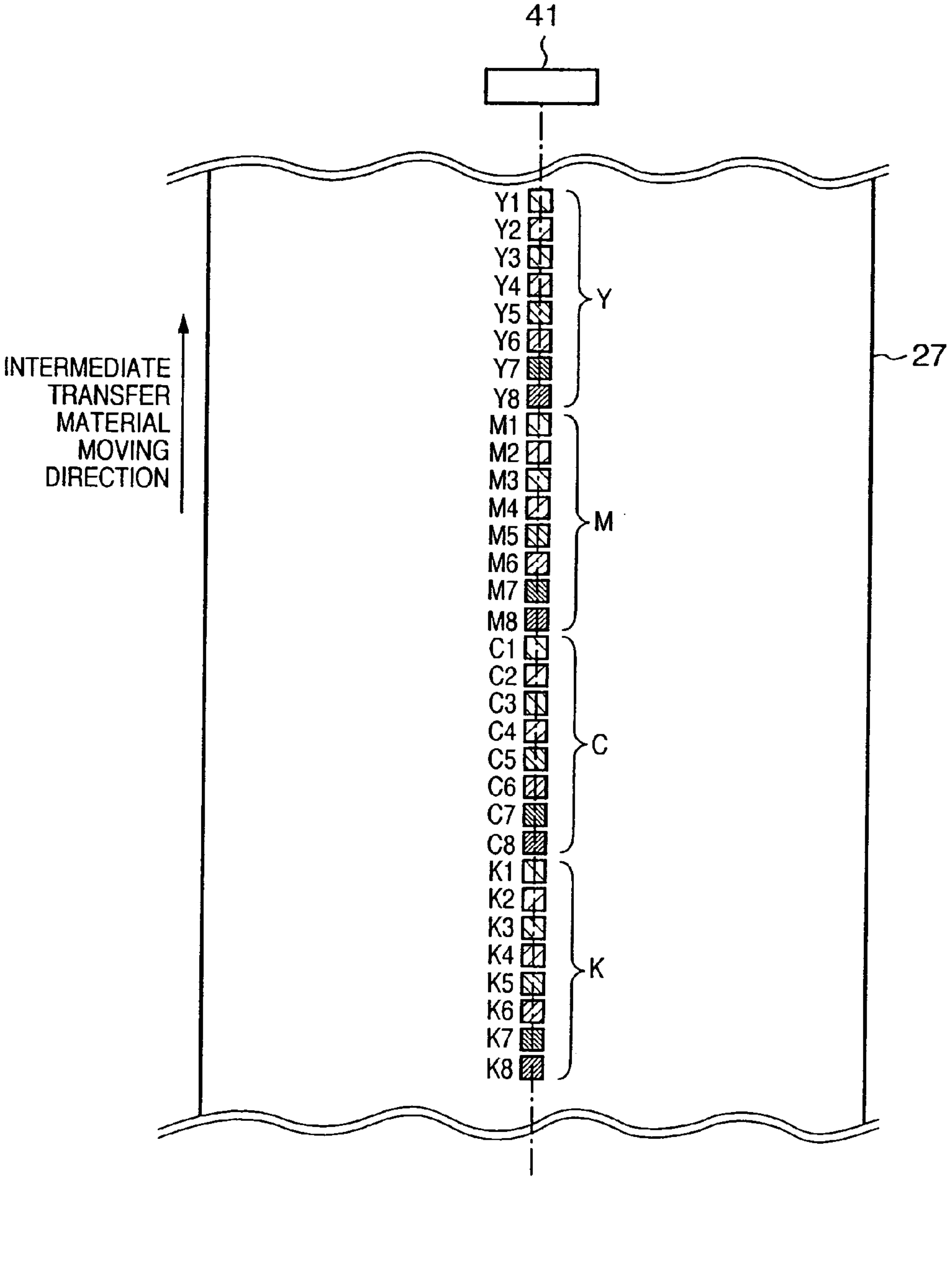
FIG. 11 depicts a view showing a patch pattern formed on an intermediate transfer material according to the third embodiment of the present invention.

FIG. 11 depicts a view showing a patch pattern formed on an intermediate transfer material 27 according to the third embodiment of the present invention.

At a portion at which the density sensor 41 is arranged, a total of 32 square patches of 8 mm side are formed at an interval of 10 mm while the rate of dots in each patch (tonality) is changed in eight stages for each of Y, M, C, and K (eight patches for each color). The correspondence between each patch and the rate of dots in each patch (tonality) is 12.5% for Y1, M1, C1, and K1, 25% for Y2, M2, C2, and K2, 37.5% for Y3, M3, C3, and K3, 50% for Y4, M4, C4, and K4, 62.5% for Y5, M5, C5, and K5, 75% for Y6, M6, C6, and K6, 87.5% for Y7, M7, C7, and K7, and 100% for Y8, M8, C8, and K8.

The density of a toner patch is detected by the density sensor 41. A method of converting the detection signal of the density sensor 41 into a density exploits a conventionally known detection signal-to-density conversion table (density conversion table 323). At the same time, the output value of the density sensor is also corrected.

Tonality correction is performed in accordance with the detection result of the density sensor 41. The correction method is the same as tonality control using the color sensor 42 that has been described in the first embodiment, and calculates a tonality correction table for obtaining a target tonality characteristic.

In actually forming an image, target tonality characteristics can be attained by correcting image data by using the tonality correction table 330.

Correction control of correcting an output from the density sensor 41 by the color sensor 42 will be explained.

Figure 12:
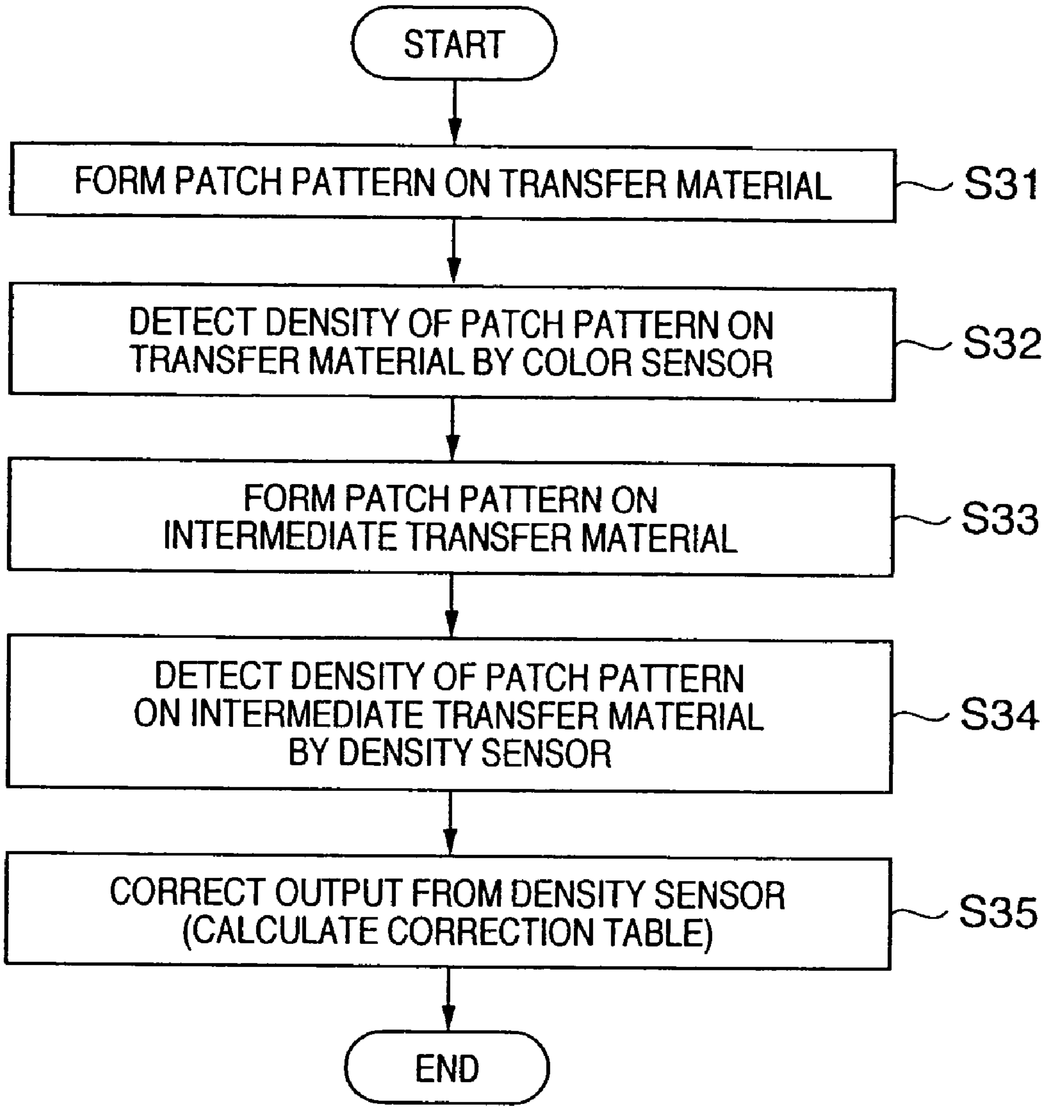
FIG. 12 is a flowchart for explaining a method of correcting an output from a density sensor on the basis of the detection result of a color sensor according to the third embodiment.

FIG. 12 is a flowchart for explaining a method of correcting an output from the density sensor 41 on the basis of the detection result of the color sensor 42 according to the third embodiment. Correction according to the third embodiment requires a toner image fixed onto the transfer material 11, and the execution frequency is preferably minimized. In the third embodiment, correction control is executed when correction control execution determination conditions (to be described later) are satisfied.

In step S31, a patch pattern for correcting an output from the density sensor 41 is formed on the transfer material 11. This is performed in the same process as general color image formation.

Figure 13:
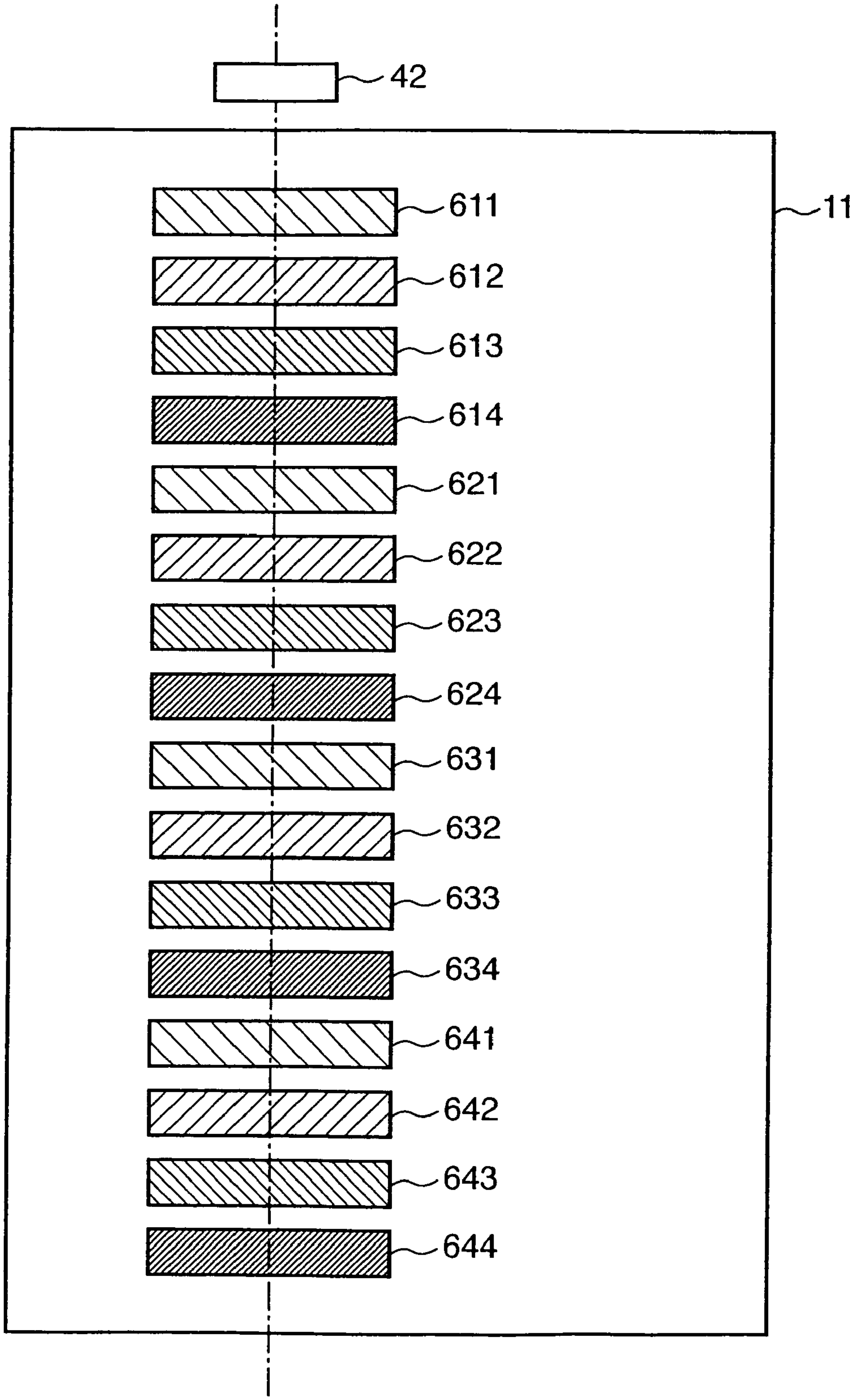
FIG. 13 depicts a view for explaining a correction patch pattern formed on a transfer material according to the third embodiment.

FIG. 13 depicts a view for explaining a correction patch pattern formed on the transfer material 11 according to the third embodiment.

The correction patch pattern is made up of a total of 16 patches: yellow tone patches 611, 612, 613, and 614, magenta tone patches 621, 622, 623, and 624, cyan tone patches 631, 632, 633, and 634, and black tone patches 641, 642, 643, and 644.

In step S32, the density of the patch pattern formed and fixed on the transfer material 11 is detected by the color sensor 42. The detection result is a value which contains variations in transfer characteristic of a toner image onto the transfer material 11 and the influence of variations in fixing characteristic, and thus this value exhibits a higher precision in comparison with detection of an unfixed toner image by the density sensor 41.

In step S33, a toner image is formed on the intermediate transfer material 27 by using the same patch data as that in step S31.

Figure 14:
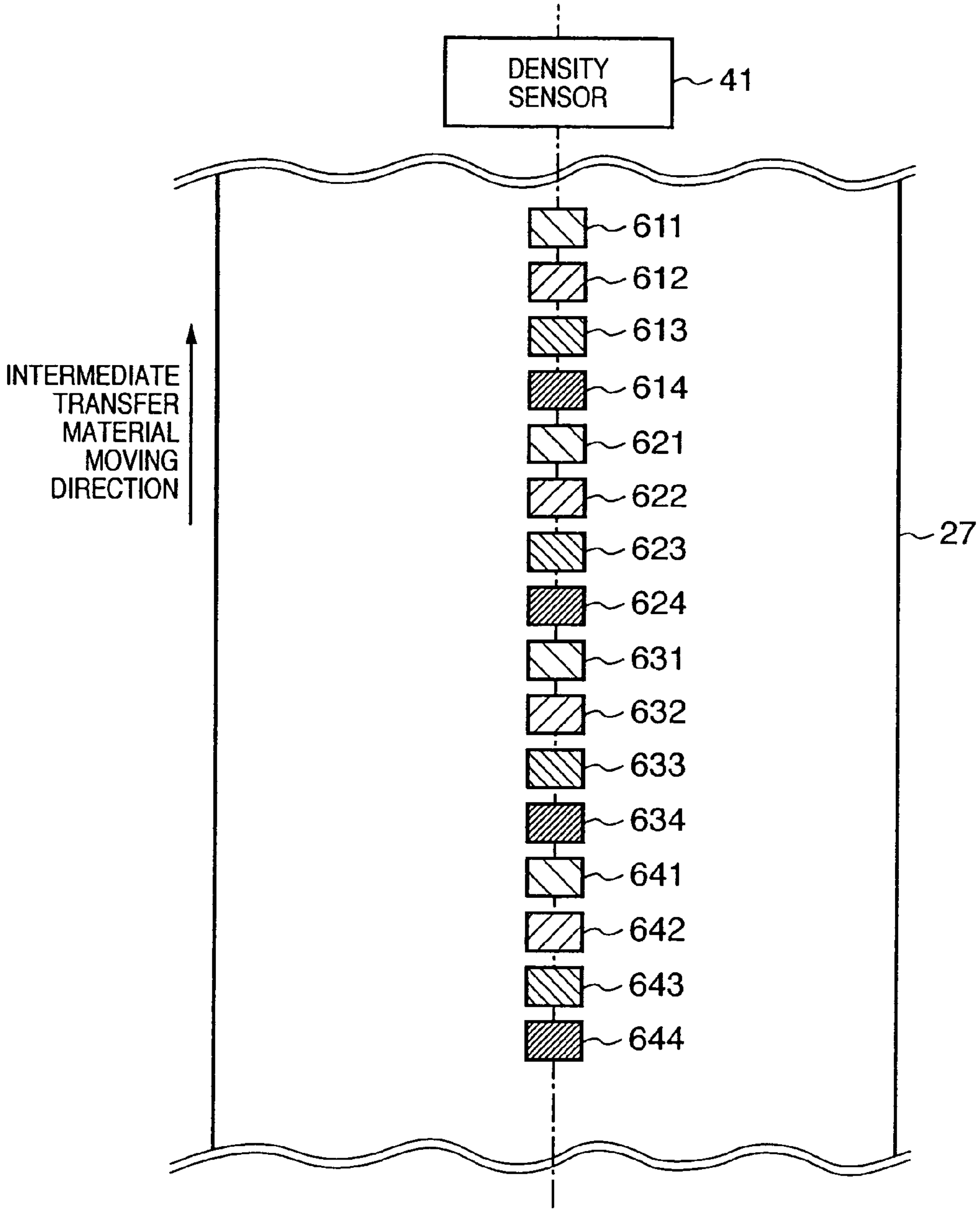
FIG. 14 depicts a view showing an example of a correction patch pattern formed on an intermediate transfer material according to the third embodiment of the present invention.

FIG. 14 depicts a view showing an example of a correction patch pattern formed on the intermediate transfer material 27 according to the third embodiment.

Details of the correction patch pattern are the same as those of the patch pattern formed on the transfer material 11 in step S31. Image forming conditions are also the same as those in step S31. In step S34, the density of the toner image formed on the intermediate transfer material 27 is detected by the density sensor 41. In step S35, an output from the density sensor 41 is corrected.

Figure 15:
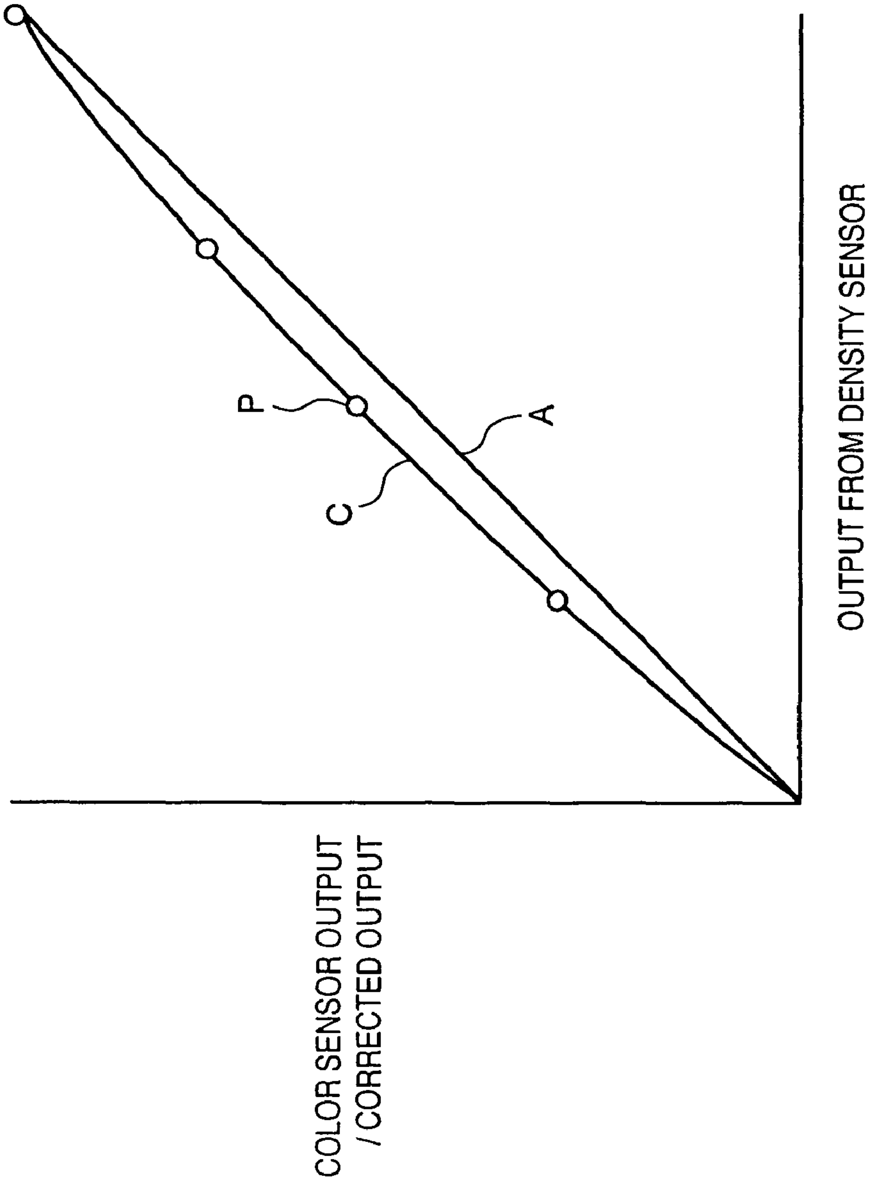
FIG. 15 is a graph for explaining correction of an output from the density sensor in step S35 according to the third embodiment.

FIG. 15 is a graph for explaining correction of an output from the density sensor 41 in step S35.

In FIG. 15, the abscissa represents the detection result (density) of the density sensor 41, and the ordinate represents the detection result of the color sensor 42. In FIG. 15, points P indicated by open circles represent the relationship between the detection result (result of detecting a patch on the transfer material 11 by the color sensor 42) in step S32 and the detection result (result of detecting a toner patch on the intermediate transfer material 27 by the density sensor 41) in step S34. A straight line A represents a case in which an output from the density sensor 41 and an output from the color sensor 42 are equal to each other, i.e., there is no measurement error of the density sensor 41 (the color sensor 42 detects a density on the transfer material 11, and thus has a high detection precision). The color sensor 42 is considered to have no measurement error). The points P do not coincide with the straight line A in FIG. 15, that is, FIG. 15 represents that a small measurement error occurs in the detection result of the density sensor 41.

The correction table (having a characteristic given by a curve C in FIG. 15) of the density sensor 41 is calculated. The characteristic C of the correction table is represented by a curve passing through the points P. The densities for tonalities (tonalities between patches) when no patch is formed are calculated by the spline interpolation between the origin and the points P. The characteristic C of the correction table is calculated for each color (yellow, magenta, cyan, and black). Calculation of the correction table value is executed by a CPU 310, and the calculated correction table is stored in a nonvolatile memory 313.

An output from the density sensor 41 is corrected using the correction table every density control described above.

In the third embodiment, the output density value of the density sensor 41 is corrected on the basis of the correction table. When the relationship between the output voltage value and density of the density sensor 41 is held as a density conversion table in advance, the density conversion table may be multiplied by the characteristic C of the correction table to create a new density conversion table.

The density conversion table of the density sensor 41 may be created directly from the relationship between the detected density value of the color sensor 42 and the output voltage value of the density sensor 41.

Figure 16:
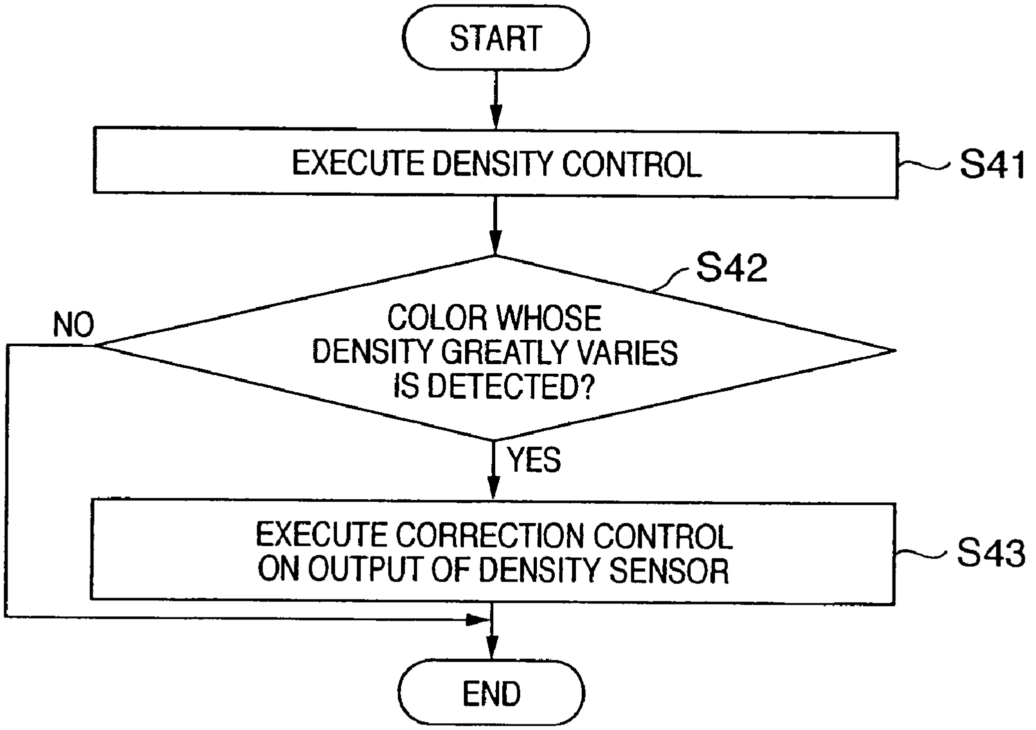
FIG. 16 is a flowchart for explaining a process of determining whether to correct an output from the density sensor according to the third embodiment of the present invention.

As a feature of the third embodiment, a process of determining whether to execute correction control of correcting an output from the density sensor 41 by using an output from the color sensor 42 will be explained with reference to the flowchart of FIG. 16. Determination of whether to execute correction control is performed every density control.

In step S41, density control is executed, details of which have been described above. In step S42, it is determined whether to execute correction control.

Figure 17:
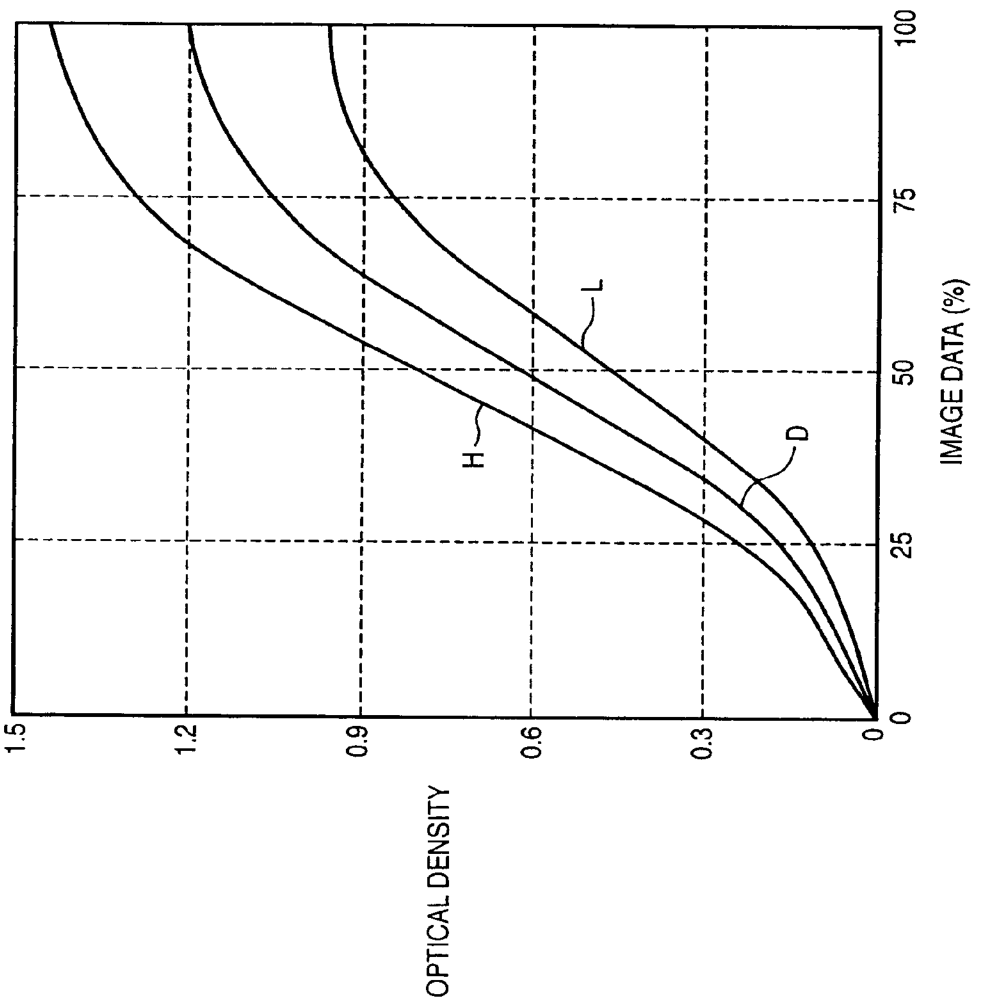
FIG. 17 is a graph for explaining an example of determination of whether to perform correction control according to the third embodiment.

FIG. 17 is a graph for explaining an example of determining whether to perform correction control according to the third embodiment.

In FIG. 17, the abscissa represents the density (tonality) of image data, and the ordinate represents the optical density detection value of the density sensor 41. A curve D represents the characteristics of density to tonality immediately after correction control of the density sensor 41 is done. The characteristics of density to tonality immediately after correction control coincide with the curve D. As image formation progresses, the density gradually changes, and the characteristics of density to tonality deviate from the curve D. The main factor which causes variations in the density of a toner image on the intermediate transfer material 27 is presumably variations in the charge characteristics of toner. The density variations are assumed to be accompanied with variations in transfer characteristic at the same time. In this case, the density detection result of the density sensor 41 cannot reflect the actual condition. When, therefore, the characteristics of density to tonality greatly vary, no accurate density control can be achieved unless an output from the density sensor 41 is corrected on the basis of the detection result of the color sensor 42.

In the third embodiment, correction control of the density sensor 41 is determined to be executed when the characteristics of density to tonality vary ±20% or more. In FIG. 17, curves H and L represent the upper limit (curve H) and lower limit (curve L) of variations in the characteristics of density to tonality. The upper and lower limits of variations in density characteristic may be set to optimal values in accordance with the characteristics and specifications of an applied image forming apparatus. This determination is performed for each of C, M, Y, and K, and when even one color is determined to require correction control, an output from the density sensor 41 is corrected using the color sensor 42.

In step S43, correction control of an output from the density sensor 41 is executed. The correction control method has been described above.

In the third embodiment, the density detection error of the density sensor 41 that is occurred by variations in transfer and fixing characteristics is corrected by correcting the output value of the density sensor 41. The same result is also obtained by correcting target characteristics of density to tonality. In an image forming apparatus which has density control means for detecting by the density sensor 41 the density of a toner image formed on an image carrier (drum) or intermediate transfer material (belt) and controlling image forming conditions in accordance with the detection result, and output correction means for detecting the light reflecting characteristics of the fixed toner image by the color sensor 42 and correcting the target control value of density control on the basis of the detection result, correction of a target control value in accordance with the calculation result of the density control means also falls within the scope of the present invention.

The third embodiment has exemplified an image forming apparatus using an intermediate transfer material as one form of the color image forming apparatus, but the present invention can also be applied to another form of the color image forming apparatus. For example, the present invention can also be applied to a color image forming apparatus which directly transfers a toner image on the photosensitive member (drum) onto a transfer material (sheet) on the transfer material carrier (conveyance belt), and can detect the patch density on the photosensitive member with the density sensor.

As described above, the third embodiment has described a method of executing output correction of correcting the output value of the density sensor in accordance with the calculation result of the density control means, and obtaining high density stability while decreasing the execution count of output correction of the density sensor using the color sensor and suppressing increases in print standby time and print cost in the image forming apparatus having the density control means for detecting by the density sensor 41 the density of an unfixed toner image formed on an image carrier and controlling image forming conditions in accordance with the detection result, and output correction means for detecting the light reflecting characteristics of the toner image on the transfer material by the color sensor and correcting the control value of the density sensor on the basis of the detection result.

The first to third embodiments have exemplified tonality control of adjusting the characteristics of density to tonality of an image as a density control method, but the density control method may be realized by another method. For example, a plurality of toner patches are formed by changing the developing bias value and charge bias value, the toner amounts of these patches are calculated, and an optimal developing bias value and optimal charge bias value are calculated in accordance with the toner amount values, thereby controlling the density.

In the first to third embodiments, the density is adopted as the light reflecting characteristics when the density sensor 41 and color sensor 42 detect a toner patch. However, the light reflecting characteristic detected by the sensors is not limited to this, and for example, the chromaticity, the optical reflectance, or a toner amount (or toner weight) calculated from the optical reflectance may be used. That is, a form in which the optical sensor detects a physical amount converted on the basis of the light reflecting characteristics of a toner patch falls within the application range of the present invention.

Other Embodiment

The present invention may be applied to a system including a plurality of devices (e.g., a host computer, interface device, reader, and printer) or an apparatus (e.g., a copying machine or facsimile apparatus) formed by a single device.

The object of the present invention is also achieved when a storage medium (or recording medium) which stores software program codes for realizing the functions of the above-described embodiments is supplied to a system or apparatus, and the computer (or the CPU or MPU) of the system or apparatus reads out and executes the program codes stored in the storage medium. In this case, the program codes read out from the storage medium realize the functions of the above-described embodiments, and the storage medium which stores the program codes constitutes the present invention. The functions of the above-described embodiments are realized when the computer executes the readout program codes. Also, the functions of the above-described embodiments are realized when an OS (Operating System) or the like running on the computer performs some or all of actual processes on the basis of the instructions of the program codes.

Furthermore, the present invention includes a case in which, after the program codes read out from the storage medium are written in the memory of a function expansion card inserted into the computer or the memory of a function expansion unit connected to the computer, the CPU of the function expansion card or function expansion unit performs some or all of actual processes on the basis of the instructions of the program codes and thereby realizes the functions of the above-described embodiments.

The present invention is not limited to the above embodiment, and various changes and modifications can be made thereto within the spirit and scope of the present invention. Therefore, to apprise the public of the scope of the present invention, the following claims are made.

CLAIM OF PRIORITY

This application claims priority from Japanese Patent Application No. 2004-139096 filed on May 7, 2004, the entire contents of which are hereby incorporated by reference herein.

What is claimed is:

1. A color image forming apparatus for converting tonality of input image data using an image conversion table and for forming an image on a transfer sheet based on the converted input image data, comprising:

a first optical detection unit configured to detect light reflecting characteristics of an unfixed toner image formed on an image carrier or a transfer sheet carrier;

a second optical detection unit configured to detect light reflecting characteristics of a fixed test toner image which is formed based on test pattern data and transferred from the image carrier or the transfer material carrier onto a transfer sheet;

a control unit configured to form the fixed test toner image on the transfer sheet based on the test pattern data and to cause the second optical detection unit to detect the fixed test toner image on the transfer sheet and to modify the image conversion table, in accordance with a detection result of detecting the fixed test toner image by the second optical detection unit, wherein the image conversion table converts tonality of the input image data so that correlation between the tonality of the input image data and light reflecting characteristics of a toner image on a transfer sheet based on the input image data becomes a prescribed correlation; and a determination unit configured to determine to cause the control unit to form the fixed test toner image on the transfer sheet and to cause the second optical detection unit to detect the light reflecting characteristics of the fixed test toner image on the transfer sheet, in a case where a detection result provided by the first optical detection unit is different from a target value by not less than a predetermined amount.

2. The apparatus according to claim 1, wherein the unfixed toner image is a predetermined pattern extracted from a print image, in a case where the predetermined pattern is extracted from the print image and a detection result provided by said first optical detection unit is different from a target value by not less than a predetermined amount, the determination unit determines that the control unit performs the control of the image forming conditions.

3. The apparatus according to claim 1, wherein the fixed test toner image contains a plurality of patch patterns which are formed with black and a plurality of coloring materials.

4. A method of controlling a color image forming apparatus for converting tonality of input image data using an image conversion table and for forming an image on a transfer sheet based on the converted input image data, comprising:

a step of detecting, by using a first optical detection sensor, light reflecting characteristics of an unfixed toner image formed on an image carrier or a transfer sheet carrier;

a step of detecting, by using a second optical detection sensor, light reflecting characteristics of a fixed toner image which is formed based on test pattern data and transferred from the image carrier or the transfer sheet carrier onto a transfer sheet;

a control step of forming the fixed test toner image on the transfer sheet based on the test pattern data and detecting the fixed test toner image on the transfer sheet using the second optical detection sensor and modifying the image conversion table, in accordance with a detection result of detecting the fixed test toner image by the second optical detection sensor, wherein the image conversion table converts tonality of the input image data so that correlation between the tonality of the input image data and light reflecting characteristics of a toner image on a transfer sheet based on the input image data becomes a prescribed correlation; and a determination step of determining to cause performance of the control step to form the fixed test toner image on the transfer sheet and to cause the second optical detection sensor to detect the light reflecting characteristics of the fixed toner image on the transfer sheet, in a case where a detection result provided by the first optical detection sensor is different from a target value by not less than a predetermined amount.

5. The method according to claim 4, wherein the unfixed toner image is a predetermined pattern extracted from a print image, in said determination step, in a case where the predetermined pattern is extracted from the print image and a detection result provided by the first optical detection sensor is different from a target value by not less than a predetermined amount, the performance of the control step performs the control of the image forming conditions.

6. The method according to claim 4, wherein the fixed test toner image contains a plurality of patch patterns which are formed with black and a plurality of coloring materials.

* * * * *